United States Patent
Bang et al.

(10) Patent No.: US 11,233,168 B2
(45) Date of Patent: Jan. 25, 2022

(54) WINDOW COVER FOR SENSOR PACKAGE COMPRISING PLURAL RADIATING UNITS EACH HAVING AN INCLINED SURFACE DISPOSED TO CORRESPOND TO EACH OF PLURAL LIGHT EMITTING ELEMENTS

(71) Applicant: AMOSENSE CO., LTD., Cheonan-si (KR)

(72) Inventors: Yeun Ho Bang, Gwangmyeong-si (KR); In Tae Yeo, Cheonan-si (KR); Seung Gon Park, Cheonan-si (KR)

(73) Assignee: AMOSENSE CO., LTD., Cheonan-si (KR)

(*) Notice: Subject to any disclaimer, the term of this patent is extended or adjusted under 35 U.S.C. 154(b) by 80 days.

(21) Appl. No.: 16/622,255

(22) PCT Filed: Jun. 8, 2018

(86) PCT No.: PCT/KR2018/006521
§ 371 (c)(1),
(2) Date: Dec. 12, 2019

(87) PCT Pub. No.: WO2018/230885
PCT Pub. Date: Dec. 20, 2018

(65) Prior Publication Data
US 2020/0135961 A1    Apr. 30, 2020

(30) Foreign Application Priority Data
Jun. 13, 2017 (KR) .......................... 10-2017-0073968

(51) Int. Cl.
*H01L 31/02* (2006.01)
*H01L 31/167* (2006.01)
(Continued)

(52) U.S. Cl.
CPC ............. *H01L 31/167* (2013.01); *G01D 11/26* (2013.01); *G02B 5/045* (2013.01); *H01L 31/0203* (2013.01)

(58) Field of Classification Search
CPC ....... G01V 8/20; H01L 31/0203; H01L 31/16; H01L 31/167
(Continued)

(56) References Cited

U.S. PATENT DOCUMENTS 8,324,602 B2 * 12/2012 Wiese .................. H01L 31/173
250/551
10,088,354 B2    10/2018 Makino

FOREIGN PATENT DOCUMENTS

JP          2015-184154 A      10/2015
KR     10-2007-0025861 A       3/2007
(Continued)

OTHER PUBLICATIONS

KR Notification of Reason for Refusal dated Apr. 18, 2019 as received in Application No. 10-2017-0073968.

*Primary Examiner* — Que Tan Le
(74) *Attorney, Agent, or Firm* — Maschoff Brennan

(57) ABSTRACT

An embodiment of the present invention provides a window cover for a sensor package and a sensor package including the same, the window cover comprising: a body; an element receiving unit disposed in the body so as to receive a light emitting element and a light receiving element of the sensor package; and a radiating unit disposed at a position corresponding to the light emitting element in the element receiving unit so as to change light generated from the light emitting element to a predetermined beam range and radiate the same.

7 Claims, 5 Drawing Sheets

(51) Int. Cl.
*H01L 31/0203* (2014.01)
*G02B 5/04* (2006.01)
*G01D 11/26* (2006.01)

(58) Field of Classification Search
USPC .................................................. 250/221, 239
See application file for complete search history.

(56) References Cited

FOREIGN PATENT DOCUMENTS

| KR | 10-2015-0018352 A | 2/2015 |
| KR | 10-2015-0130193 A | 11/2015 |
| KR | 10-2016-0142175 A | 12/2016 |

\* cited by examiner

WINDOW COVER FOR SENSOR PACKAGE COMPRISING PLURAL RADIATING UNITS EACH HAVING AN INCLINED SURFACE DISPOSED TO CORRESPOND TO EACH OF PLURAL LIGHT EMITTING ELEMENTS

TECHNICAL FIELD

The present disclosure relates to a window cover for transmitting infrared light and a sensor package including same.

BACKGROUND ART

Recently, electronic devices such as a smartphone, a tablet computer, and a laptop computer are equipped with various sensor packages. These sensor packages are mainly electrical devices for receiving and measuring a signal from the outside. Therefore, at least a portion thereof is exposed to the outside of the electronic device in order to receive the signal from the outside.

The sensor package includes a sensing element such as a light emitting element or a light receiving element, radiates a light source from the light emitting element to the target to be applied such as a headset, generates a measured value by using the amount of light source incident on the light receiving element from the target to be applied, and transmits it to various applications. The application provides various services, such as a communication service and a vehicle control service by using the measured value received from the sensor package.

For example, referring to FIG. 1, a vehicle 10 may be provided with an electronic device 20 such as a tablet computer or an LCD display to be watchable or listenable by a driver or a passenger. A sensor package 30 for transmitting and receiving voice and remote control signals may be applied to the electronic device 20.

However, the conventional sensor package 30 has a limited directing angle of the light emitted from the light emitting element to the target to be applied, thereby restricting a usable range inevitably.

For example, when the LCD display is installed behind the headrest 11 of a driver seat, a passenger who rides in the rear seat of the driver seat is free to use a wireless headset or to transmit a signal with the LCD display by operating a remote controller, but the passengers who ride in other seats do not smoothly transmit or receive signals for the operation due to the limited light directing angle (light distribution angle) of the sensor package mounted on the LCD display.

DISCLOSURE

Technical Problem

An object of an embodiment of the present disclosure is to provide a window cover for a sensor package and the sensor package including same, which may increase a light distribution region of the sensor package so that a plurality of users may efficiently transmit a signal.

Technical Solution

A window cover for a sensor package according to an embodiment of the present disclosure may include a body; an element receiving unit prepared inside the body, and for receiving the light emitting element and the light receiving element of the sensor package; and a radiating unit disposed at a position corresponding to the light emitting element of the element receiving unit, and for changing the light generated from the light emitting element to a predetermined beam range and radiating the same.

In an embodiment of the present disclosure, the light emitting element and the radiating unit may be provided in plural to correspond to each other, and at least two of the plurality of radiating units may have light directing angles different from each other.

In an embodiment of the present disclosure, the radiating units may have the light directing angles different from each other, respectively.

In an embodiment of the present disclosure, the light directing angles of the radiating units may be 10° to 120°.

In an embodiment of the present disclosure, the radiating unit may be formed in a groove shape having a triangular cross section to be concave from the element receiving unit to the body side.

In an embodiment of the present disclosure, the radiating unit may include a vertical surface formed perpendicular to the bottom surface of the body, and an inclined surface connecting the end portion of the vertical surface and the bottom surface of the body, and the inclined surface may change the directing angle of the light generated by the light emitting element.

In an embodiment of the present disclosure, the inclination of the inclined surface may gradually increase from the radiating unit at one side thereof toward the radiating unit at the other side thereof among the plurality of radiating units disposed on the window cover.

In an embodiment of the present disclosure, the light emitting element may be an infrared light emitting element having a wavelength range of 800 nm to 1000 nm.

In an embodiment of the present disclosure, a material of the window cover may be any one selected from polycarbonate, polymethylmethacrylate, silicone, and glass.

Further, a sensor package according to an embodiment of the present disclosure may include a base substrate having a first surface and a second surface opposite thereto; a sensing element including a plurality of light emitting elements and at least one light receiving element mounted on the first surface of the base substrate; and a window cover including a body coupled to the first surface of the base substrate, an element receiving unit prepared inside the body and for receiving the sensing elements, and a plurality of radiating units disposed at one side of the element receiving unit to correspond to the sensing elements and for changing the light generated from the respective sensing elements to a predetermined beam range and radiating the same, and at least two of the radiating units may have the light directing angles different from each other.

The sensor package according to an embodiment of the present disclosure includes a base substrate having a first surface and a second surface opposite thereto, a sensing element including a plurality of light emitting elements and at least one light receiving element mounted on the first surface of the base substrate, and a window cover disposed on the base substrate to cover the sensing element.

The window cover includes a body, an element receiving unit, and a radiating unit. The element receiving unit is prepared inside the body to receive a light emitting element and a light receiving element of the sensor package. The radiating unit is disposed at a position corresponding to the light emitting element of the element receiving unit, and the radiating unit changes the light generated from the light emitting element to a predetermined beam range and radiates it.

Advantageous Effects

According to an embodiment of the present disclosure, since the light directing angle of the window cover may be maximized, a plurality of users may transmit and receive the optical signal smoothly regardless of the seat position.

BEST MODE

Figure 1:
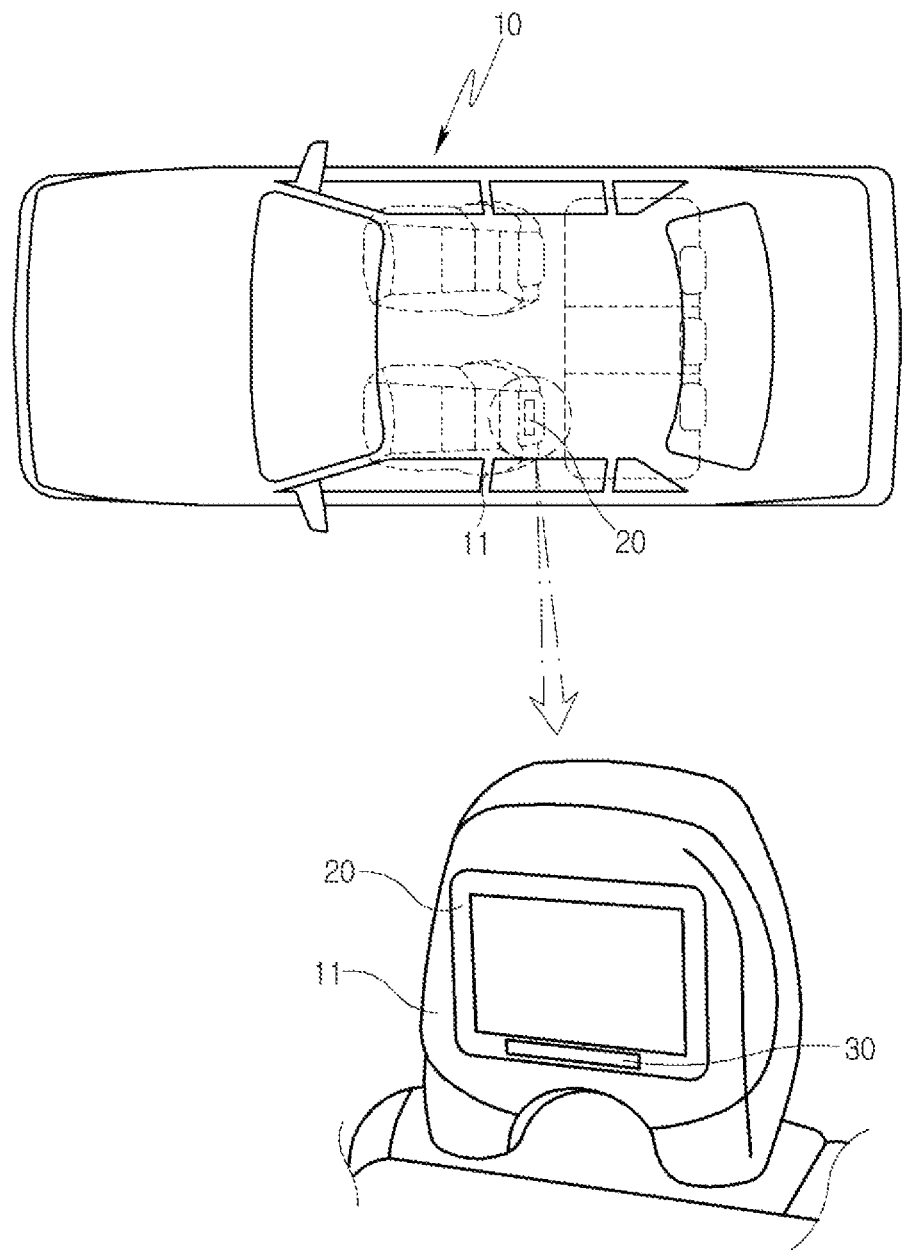
FIG. 1 is a schematic diagram illustrating a state where a sensor package has been generally applied to an electronic device for a vehicle.

Hereinafter, the present disclosure will be described with reference to the accompanying drawings. However, the present disclosure may be implemented in various different forms, and therefore, is not limited to the embodiment described herein. Further, in the drawing, in order to clearly describe the present disclosure, parts not relevant to the description have been omitted, and similar parts have been denoted by similar reference numerals throughout the specification.

Figure 2:
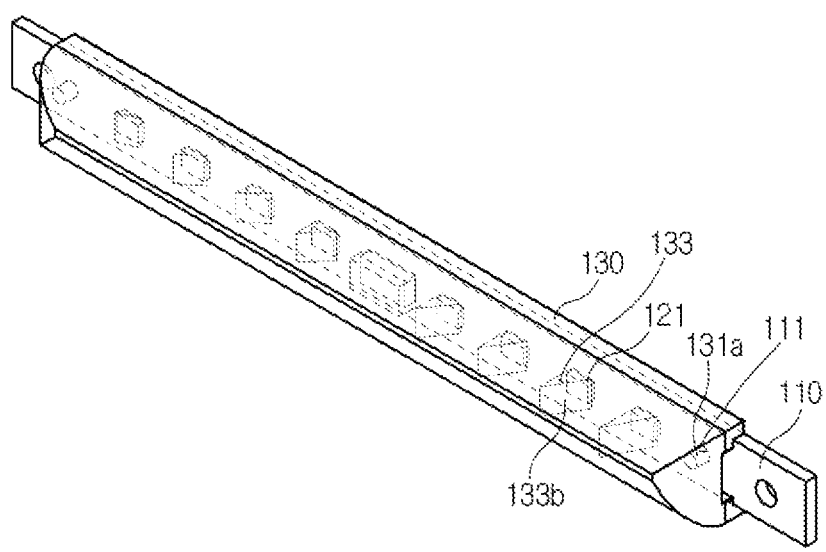
FIG. 2 is a perspective diagram illustrating a sensor package according to an embodiment of the present disclosure.
Figure 3:
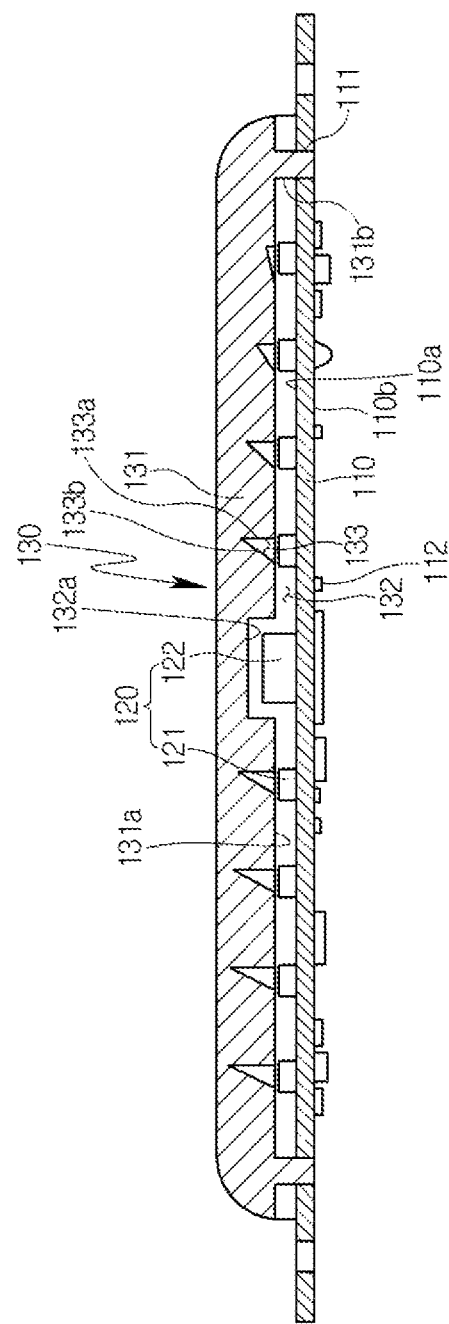
FIG. 3 is a cross-sectional diagram illustrating the coupled state of the sensor package according to an embodiment of the present disclosure.
Figure 4:
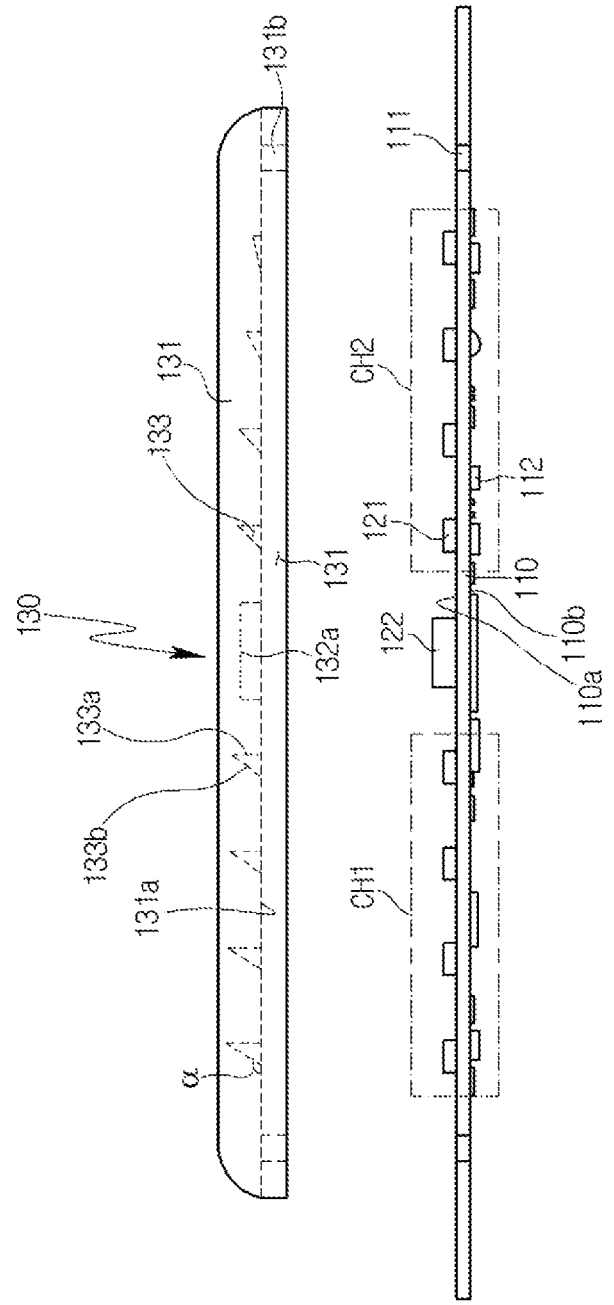
FIG. 4 is an exploded cross-sectional diagram of the sensor package according to an embodiment of the present disclosure.
Figure 5:
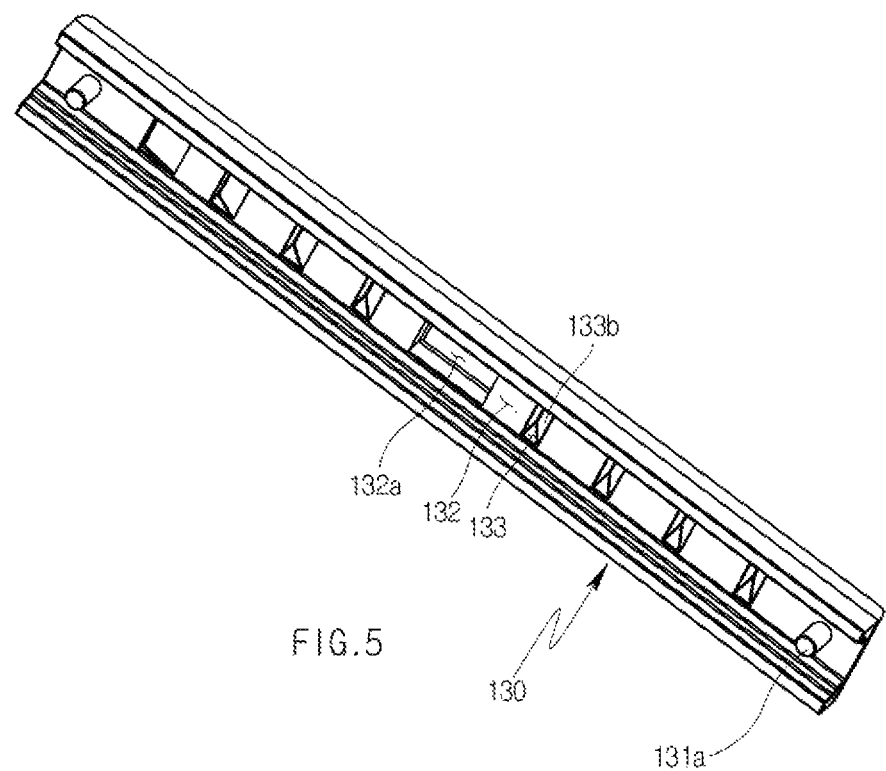
FIG. 5 is a perspective diagram illustrating a window cover for a sensor package according to an embodiment of the present disclosure.

Referring to FIGS. 2 to 4, the sensor package 100 according to an embodiment includes a base substrate 110, a sensing element 120, and a window cover 130.

The base substrate 110 may have a first surface 110a (upper surface in FIG. 2) and a second surface 110b opposite thereto, and may be formed in a flat plate shape. The base substrate 110 may be formed of a Printed Circuit Board (PCB) having a predetermined thickness. A terminal 112 may be formed on the first surface 110a and the second surface 110b of the base substrate 110, respectively, and the respective terminals may input or output a signal or deliver power.

The sensing element 120 may be mounted on the first surface 110a of the base substrate 110. The sensing element 120 may be electrically connected with the terminals through a solder ball or a conductive wire. Through this connection, the sensing element 120 may receive power from the base substrate 110 and may also transmit or receive the signal.

The sensing element 120 may be an electric device for measuring various information of an external environment to convert it into an electrical signal. For example, an infrared sensor having a wavelength range of 800 nm to 1000 nm may be applied to the sensing element 120. Specifically, as illustrated in FIG. 3, the sensing element 120 may include a plurality of light emitting elements and a light receiving element mounted on the first surface 110a of the printed circuit board.

According to an embodiment, the sensing element 120 may include a light receiving element 122 mounted in the center of the longitudinal direction of the base substrate 110 and a light emitting element 121 symmetrically mounted on both sides of the light receiving element 122. The light emitting elements 121 disposed at both sides with respect to the light receiving element 122 may be divided into respective channels. For example, groups of light emitting elements 121 positioned at the left side of the light receiving element 122 may be classified as a first channel (CH1) and groups of light emitting elements 121 positioned at the right side of the light receiving element 122 may be classified as a second channel (CH2). However, the arrangement of the light emitting element 121 and the light receiving element 122 is not necessarily limited to the above arrangement and its design may be changed as necessary.

The window cover 130 is coupled to the first surface 110a of the base substrate 110 to receive the sensing element 120. The window cover 130 includes a body 131 and an element receiving unit 132.

The body 131 forms the overall appearance of the window cover 130 and is coupled to the base substrate 110 to correspond to a direction in which light generated from the light emitting element 121 is radiated. For example, guide protrusions 131b may be formed to be protruded at both ends of the body 131 in the longitudinal direction, respectively, and guide holes 111 may be formed at both ends of the base substrate 110 so that the guide protrusions 131b are coupled to corresponding thereto. On the contrary, although not illustrated, the guide holes may be formed at both ends of the body 131 in the longitudinal direction, respectively, and the guide protrusions may be formed to be protruded at both ends of the base substrate so as to be coupled to correspond to the guide holes.

The body 131 is made of a light transmissive material that may transmit light. For example, the body 131 may be formed of a light transmissive resin such as polycarbonate and polymethylmethacrylate (PMMA) that are easily injected while having transparency and excellent mechanical strength.

Further, the body 131 may be prepared to optionally transmit only light in a specific wavelength region, and according to an embodiment, may be formed to transmit light in an infrared wavelength band of 800 nm to 1000 nm.

The element receiving unit 132 is disposed above the sensing element 120 mounted on the base substrate 110 when the window cover 130 and the base substrate 110 are coupled to each other. For example, the element receiving unit 132 may be a space implemented in the form of a groove from the lower side to the upper side direction of the body 131 to receive the plurality of sensing elements 120. At this time, a separate light receiving element receiving groove 132a may be further formed in the element receiving unit 132 to prevent signal interference between the light emitting element 121 and the light receiving element 122 among the sensing elements 120.

Meanwhile, when the window cover 130 and the base substrate 110 are coupled to each other, if the bottom surface 131a of the body 131 and the sensing element 120 directly contact each other and no gap is formed between the bottom surface 131a of the body 131 and the sensing element 120, the light output efficiency of the sensing element 120 may be maximized, but if the body 131 is manufactured to contact the sensing element 120, there may occur problems such as the coupled failure of the window cover 130 and the base substrate 110, the breakage of the sensing element 120, a change in the directing angle, and a reduction in the light emission performance due to the assembly tolerance. Therefore, the bottom surface 131a of the body 131 and the upper surface of the sensing element 120 are preferably formed to have the spacing distance of about 500 μm or less to form a gap therebetween.

Meanwhile, the window cover 130 in an embodiment further includes a radiating unit 133 at a position corresponding to each sensing element 120. The radiating unit 133 may be formed in a groove shape having a triangular cross section to be concave upwards from the element receiving unit 132 to the upper side of the body 131.

In an embodiment, the radiating unit 133 may include a vertical surface 133a formed perpendicular to the bottom surface 131a of the body 131, and an inclined surface 133b connecting the end portion of the vertical surface 133a and one end of the bottom surface 131a of the body 131.

The inclined surface 133b changes the directing angle (a) of the light generated by the sensing element so that the light is distributed to the target to be applied. Therefore, the inclined surface 133b has a predetermined inclination so that the light directing angle is changed to deliver the optical signal generated by the sensing element 120 to the target to be applied, for example, a headset, a remote controller, or the like.

At this time, the inclined surfaces 133b formed on at least two radiating units 133 of the plurality of radiating units 133 may have the light directing angles different from each other. More preferably, the radiating surface 133a provided in each radiating unit 133 may be formed to have the light directing angles different from each other. At this time, the vertical surfaces 133a provided in each of the radiating units 133 are formed to have the lengths different from each other.

The light directing angle of the radiating unit 133 according to an embodiment may be set in a range of 10° to 120°. In particular, the plurality of inclined surfaces 133b may be formed so that the light directing angle gradually increases from the radiating unit 133 positioned at one side end portion of the base substrate 110 toward the radiating unit 133 positioned at the other side end portion thereof. That is, the inclination of the inclined surface 133b with respect to the bottom surface 131a of the body 131 may be set to increase or decrease gradually from the radiating unit 133 at one side thereof toward the radiating unit 133 at the other side thereof.

For example, if the radiating unit 133 corresponding to the sensing element 120 positioned at one side end portion of the base substrate 110 has the inclination of the radiating surface 133a to be formed to have a directing angle of 10°, the radiating unit 133 corresponding to the sensing element 120 positioned at the other side end portion of the base substrate 110 may have the inclination of the radiating surface 133a to be formed to have a directing angle of 120°. Meanwhile, the radiating unit 133 may be formed to be spaced at a predetermined interval apart from each sensing element 120 by the element receiving unit 132.

Figure 6:
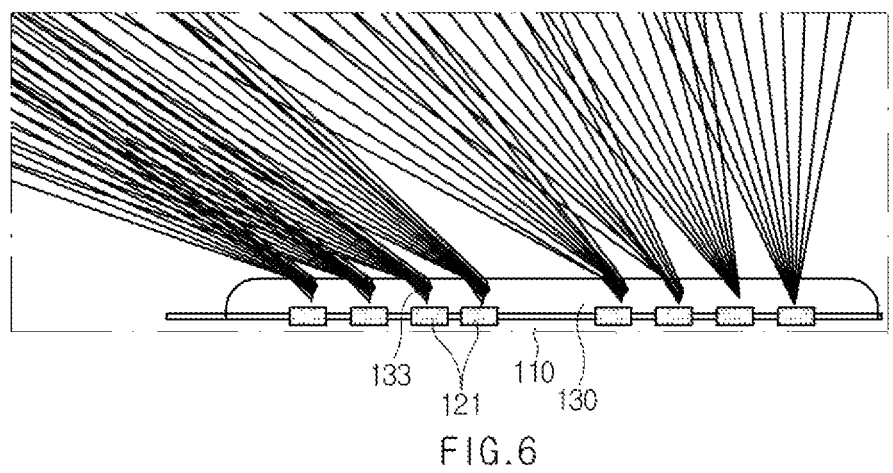
FIG. 6 is a usage state diagram to which the sensor package has been applied according to an embodiment of the present disclosure.

FIG. 6 illustrates an example in which the radiating unit 133 of the window cover 130 is designed to be light-distributed at a setting angle so that the light source may be radiated to the region of a desired range according to an embodiment.

Referring to FIG. 6, if the sensor package is designed to have a specific range of light directing angle characteristics, the emitting range of the light may be widened while the light emitted from the light emitting element 121 is emitted through the inclined surface 133b having the different inclinations from each other of each radiating unit 133 of the window cover 130 designed.

As described above, each radiating unit 133 is designed at the directing angles different from each other with respect to the horizontal plane of the base substrate 110, thereby smoothly matching the radiating range of light to a desired region.

Therefore, if a plurality of users use the electronic devices, or the like, in which the sensor package has been installed in a vehicle interior, the sensor package may smoothly output the optical signal to all the plurality of users or receive the signal from the target to be applied of each of users by maximizing the direction angle of the window cover 130. That is, the plurality of users who ride in the vehicle may use the electronic device smoothly without being limited to the seat position, or the like.

The foregoing description of the present disclosure is intended for illustration, and it will be understood by those skilled in the art to which the present disclosure pertains that the present disclosure may be easily modified in other specific forms without changing the technical spirit or essential features of the present disclosure.

The invention claimed is:

1. A window cover installed in a sensor package comprising a plurality of light emitting elements and a light receiving element, the window cover for the sensor package comprising:
   a body;
   an element receiving unit prepared inside the body, and for receiving the elements and the light receiving element of the sensor package; and
   a plurality of radiating units disposed at a position corresponding to the elements of the element receiving unit, and for changing the light generated from the elements to a predetermined beam range and radiating the same,
   wherein each of the plurality of radiating units are disposed to correspond to each of the plurality of light emitting elements,
   wherein each of the plurality of radiating units has an inclined surface,
   wherein each of the inclined surfaces of the plurality of radiating units has inclination different from each other such that directing angles of lights radiated from the plurality of radiating units are different from each other.

2. The window cover for the sensor package of claim 1, wherein the light directing angles of the plurality of radiating units are 10° to 120.

3. The window cover for the sensor package of claim 1, wherein the each of the plurality of radiating unit is formed in a groove shape having a triangular cross section to be concave from the element receiving unit to the body side.

4. The window cover for the sensor package of claim 3, wherein the each of the plurality of radiating unit comprises a vertical surface formed perpendicular to the bottom surface of the body, and the inclined surface connecting the end portion of the vertical surface and the bottom surface of the body, and the inclined surface changes the directing angle of the light generated by the light emitting elements.

5. The window cover for the sensor package of claim 4, wherein the inclination of the inclined surface gradually increases from a radiating unit at one side thereof toward a radiating unit at the other side thereof among the plurality of radiating units disposed on the window cover.

6. The window cover for the sensor package of claim 1, wherein the light emitting elements are infrared light emitting elements having a wavelength range of 800 nm to 1000 nm.

7. The window cover for the sensor package of claim 1, wherein a material of the window cover is any one selected from polycarbonate, polymethylmethacrylate, silicone, and glass.

* * * * *